(12) United States Patent
Yoo et al.

(10) Patent No.: US 11,981,843 B2
(45) Date of Patent: May 14, 2024

(54) PROTECTION FILM HAVING VARIABLE ADHESION FOR FOLDABLE DISPLAY AND FOLDABLE DISPLAY DEVICE COMPRISING SAME

(71) Applicant: LG CHEM, LTD., Seoul (KR)

(72) Inventors: Han Sol Yoo, Daejeon (KR); Hyun Cheol Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 211 days.

(21) Appl. No.: 17/621,986

(22) PCT Filed: Nov. 11, 2020

(86) PCT No.: PCT/KR2020/015742
§ 371 (c)(1),
(2) Date: Dec. 22, 2021

(87) PCT Pub. No.: WO2021/096208
PCT Pub. Date: May 20, 2021

(65) Prior Publication Data
US 2022/0251425 A1 Aug. 11, 2022

(30) Foreign Application Priority Data
Nov. 15, 2019 (KR) .......... 10-2019-0146812

(51) Int. Cl.
| | | |
|---|---|---|
| *B32B 7/12* | (2006.01) | |
| *B32B 27/28* | (2006.01) | |
| *B32B 27/32* | (2006.01) | |
| *B32B 27/36* | (2006.01) | |
| *C08F 2/48* | (2006.01) | |
| *C08F 220/18* | (2006.01) | |
| *C09J 7/38* | (2018.01) | |
| *H10K 50/84* | (2023.01) | |
| *H10K 77/10* | (2023.01) | |
| *H10K 102/00* | (2023.01) | |

(52) U.S. Cl.
CPC .......... *C09J 7/385* (2018.01); *B32B 7/12* (2013.01); *B32B 27/281* (2013.01); *B32B 27/286* (2013.01); *B32B 27/288* (2013.01); *B32B 27/325* (2013.01); *B32B 27/36* (2013.01); *B32B 27/365* (2013.01); *C08F 2/48* (2013.01); *C08F 220/1802* (2020.02); *H10K 50/84* (2023.02); *B32B 2255/10* (2013.01); *B32B 2255/26* (2013.01); *B32B 2307/412* (2013.01); *B32B 2307/54* (2013.01); *B32B 2457/206* (2013.01); *C09J 2301/312* (2020.08); *C09J 2433/00* (2013.01); *H10K 77/111* (2023.02); *H10K 2102/311* (2023.02)

(58) Field of Classification Search
None
See application file for complete search history.

(56) References Cited

U.S. PATENT DOCUMENTS

| | | |
|---|---|---|
| 2004/0037990 A1 | 2/2004 | Abe et al. |
| 2016/0168298 A1* | 6/2016 | Woods ............... C08F 120/14 526/135 |
| 2019/0316004 A1 | 10/2019 | Clapper et al. |
| 2020/0216708 A1* | 7/2020 | Goddard ............... B32B 27/302 |
| 2020/0332153 A1 | 10/2020 | Park et al. |

FOREIGN PATENT DOCUMENTS

| | | |
|---|---|---|
| JP | 2002-053834 A | 2/2002 |
| KR | 10-1580544 A | 12/2015 |
| KR | 10-2019-0019554 A | 2/2019 |
| KR | 10-2019-0041684 A | 4/2019 |
| KR | 10-2019-0089900 A | 7/2019 |
| KR | 10-2019-0113633 A | 10/2019 |
| KR | 10-2019-0119520 A | 10/2019 |
| WO | 2019117594 A1 | 6/2019 |
| WO | 2019190242 A1 | 10/2019 |

OTHER PUBLICATIONS

International Search Report dated Mar. 2, 2021, issued in the corresponding International Application No. PCT/KR2020/015742, 4 pages.

* cited by examiner

*Primary Examiner* — Sheeba Ahmed
(74) *Attorney, Agent, or Firm* — ROTHWELL, FIGG, ERNST & MANBECK, P.C.

(57) ABSTRACT

The present disclosure provides a foldable display protective film having variable adhesive strength and a foldable display device including the same.

16 Claims, 1 Drawing Sheet

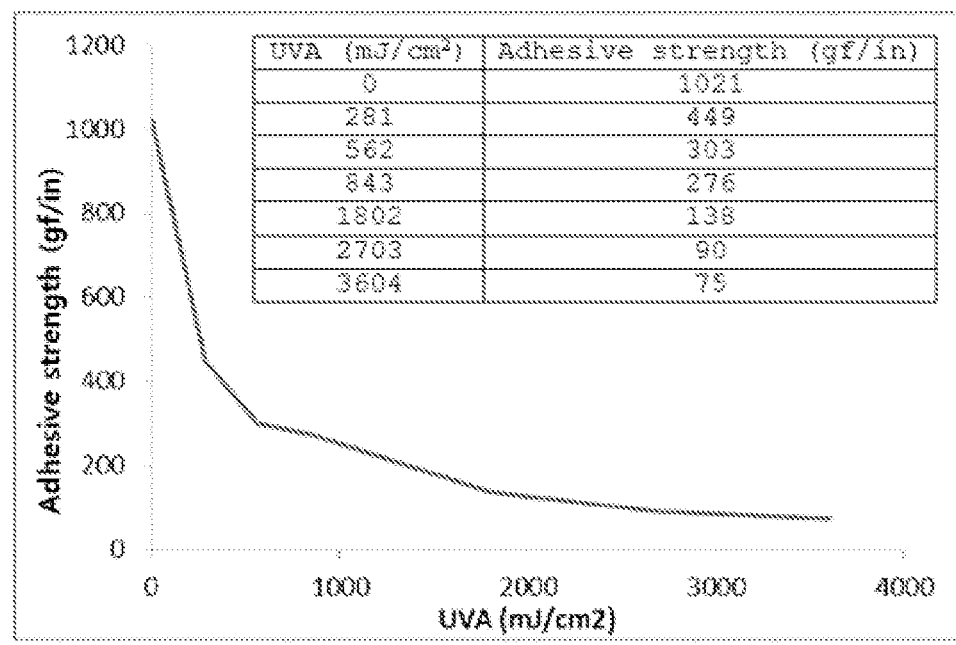

PROTECTION FILM HAVING VARIABLE ADHESION FOR FOLDABLE DISPLAY AND FOLDABLE DISPLAY DEVICE COMPRISING SAME

This application is a 35 U.S.C. 371 National Phase Entry application from PCT/KR2020/015742, filed on Nov. 11, 2020, which claims the benefit of the filing date of Korean Patent Application No. 10-2019-0146812, filed on Nov. 15, 2019, in the Korean Intellectual Property Office, the disclosures of which are incorporated herein in their entirety by reference.

TECHNICAL FIELD

The present disclosure relates to a foldable display protective film having variable adhesive strength and a foldable display device including the same.

BACKGROUND OF THE INVENTION

In recent years, with the development of display-related technologies, research and development have been made on display devices that may be subjected to deformations, such as folding, rolling to a roll shape, or elastic stretching, during use. Since these displays may be deformed in various forms, they can satisfy both the demand for increased size during use and the demand for reduced size for portability.

In addition, portable terminals such as wireless terminals, personal digital assistants (PDAs), portable multimedia players (PMPs), and electronic notebooks, have recently become smaller in size for portability.

However, since users want to receive text information and information from various contents such as videos or games through the screens of portable terminals, it is required to enlarge or widen the sizes of the display screens. However, since the reduction in the size of the portable terminal leads to a reduction in the size of the display screen, there is a limitation in satisfying both the two demands.

Conventional display devices have used unbreakable displays that are not deformed, but in order to overcome the above-described limitation, deformable displays have been developed, such as curved displays, bended displays, foldable displays and rollable displays.

The deformable display devices may not only be deformed in a predetermined form, but be deformed in various forms in response to the user's demand or to the needs of a situation in which the display device is used. Accordingly, it is necessary to recognize the deformed form of the display and to control the display device in response to the recognized form.

Meanwhile, a cover window is applied to prevent a panel from being damaged during the use of a tablet PC or smartphone to which a deformable display is applied, and a protective film is attached to the cover window to prevent the cover window surface from being scratched or contaminated.

This protective film needs to be designed to have a sufficiently high adhesive strength to the cover window because it should be prevented from being detached during the use of the foldable display which is repeatedly folded and unfolded. However, if the adhesive strength is at an appropriate level, problems such as damage to the cover window or breakage of the inner panel may occur when the user attempts to peel the protective film arbitrarily.

Therefore, in order to solve such problems, the protective film should remain strongly attached to the display device during use, and the adhesive strength thereof should be lowered by light irradiation when replacement is desired, so that damage to the display device may be prevented from occurring when the protective film is removed. However, if the adhesive strength is excessively lowered, a problem may arise in that the protective film is detached during the process of folding and unfolding the display. Therefore, the adhesive strength needs to be maintained at a certain level after light irradiation.

BRIEF SUMMARY OF THE INVENTION

An object to be achieved by the present disclosure is to provide a foldable display protective film including an adhesive film having variable adhesive strength, and a foldable display device including the same.

In accordance with one aspect of the present disclosure, there is provided a foldable display protective film including: an adhesive layer including an adhesive composition including a (meth)acrylate resin produced by copolymerization of a mixture containing an alkyl (meth)acrylate monomer, a crosslinkable functional group-containing monomer, and a photoinitiator monomer; and a protective substrate provided on one surface of the adhesive layer, wherein the photoinitiator monomer is contained in an amount of 0.2 to 4.5 wt % based on the total weight of the mixture, the protective substrate is maintained without being damaged or detached when subjected to a 4-mm radius folding test, and the protective film satisfies the following equation 1:

$$1 \leq 100*B/A \leq 30 \qquad \text{[Equation 1]}$$

wherein A is an adhesive strength measured at 23° C. and 50 RH % before light irradiation after a surface of the adhesive layer, which is opposite to a surface thereof being in contact with the protective substrate, is attached to a PI substrate, and B is an adhesive strength measured at 23° C. and 50 RH % after irradiation with light having a wavelength of 380 nm or less after the surface of the adhesive layer, which is opposite to the surface thereof being in contact with the protective substrate, is attached to the PI substrate.

In accordance with another aspect of the present disclosure, there is provided a foldable display device including: a foldable display; and the foldable display protective film provided on one surface of the foldable display, wherein the adhesive layer of the foldable display protective film is in contact with one surface of the foldable display.

Advantageous Effects

When the foldable display protective film according to one embodiment of the present disclosure is exposed to UV light, the adhesive layer thereof is cured slowly, so that the adhesive strength thereof is decreased slowly. Thus, the foldable display protective film may be effectively removed without causing damage to a cover window in a later peeling process.

BRIEF DESCRIPTION OF DRAWINGS

FIG. 1 is a graph showing UV dose-dependent changes in adhesive strength of a foldable display protective film fabricated in Example 1.

DETAILED DESCRIPTION OF THE INVENTION

Throughout the present specification, it is to be understood that when any part is referred to as "including" any component, it does not exclude other components, but may further include other components, unless otherwise specified.

Hereinafter, the present disclosure will be described in more detail.

In accordance with one embodiment of the present disclosure, there is provided a foldable display protective film including: an adhesive layer including an adhesive composition including a (meth)acrylate resin produced by copolymerization of a mixture containing an alkyl (meth)acrylate monomer, a crosslinkable functional group-containing monomer, and a photoinitiator monomer; and a protective substrate provided on one surface of the adhesive layer, wherein the photoinitiator monomer is contained in an amount of 0.2 to 4.5 wt % based on the total weight of the mixture, the protective substrate is maintained without being damaged or detached when subjected to a 4-mm radius folding test, and the protective film satisfies the following equation 1:

$$1 \leq 100*B/A \leq 30 \quad \text{[Equation 1]}$$

wherein A is an adhesive strength measured at 23° C. and 50 RH % before light irradiation after a surface of the adhesive layer, which is opposite to a surface thereof being in contact with the protective substrate, is attached to a PI substrate, and B is an adhesive strength measured at 23° C. and 50 RH % after irradiation with light having a wavelength of 380 nm or less after the surface of the adhesive layer, which is opposite to the surface thereof being in contact with the protective substrate, is attached to the PI substrate.

According to one embodiment of the present disclosure, the mixture contains an alkyl (meth)acrylate monomer, a crosslinkable functional group-containing monomer, and a photoinitiator monomer. The mixture may be copolymerized to produce a (meth)acrylate resin. Specifically, the mixture may be copolymerized by a bulk polymerization or solution polymerization process to produce a (meth)acrylate resin.

According to one embodiment of the present disclosure, the photoinitiator monomer may be a benzophenone-based compound having a (meth)acrylate group. Specifically, the photoinitiator monomer may be 4-benzoylphenyl (meth)acrylate or N-(2-benzoylphenyl)acrylamide.

Where the photoinitiator monomer is a benzophenone-based compound having a (meth)acrylate group, a crosslinking reaction may occur smoothly upon light irradiation due to the (meth)acrylate functional group contained therein, and the photoinitiator monomer may also serve as a monomer and a curing agent.

According to one embodiment of the present disclosure, the photoinitiator monomer may be contained in an amount of 0.2 to 4.5 wt %, 0.5 to 4.5 wt %, or 0.5 to 2.9 wt %, based on the weight of the mixture. Where the adhesive composition according to one embodiment of the present disclosure contains the photoinitiator monomer in an amount within the above range, the adhesive composition may be cured slowly when irradiated with UV light, so that the adhesive strength thereof may be lowered, and damage to the cover window may be prevented even when the protective film is peeled from the foldable display.

According to one embodiment of the present disclosure, although the alkyl (meth)acrylate monomer is not particularly limited, the alkyl (meth)acrylate monomer may include, for example, at least one of pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate and decyl (meth)acrylate, which are monomers containing an alkyl group having 1 to 12 carbon atoms. Preferably, the alkyl (meth) acrylate monomer may be 2-ethylhexyl acrylate.

In the present specification, the term "(meth)acrylate" is meant to include both acrylate and methacrylate.

According to one embodiment of the present disclosure, the crosslinkable functional group-containing monomer may include at least one of a carboxyl group-containing monomer and a hydroxyl group-containing monomer. A carboxyl group and a hydroxyl group are crosslinkable functional groups, and a carboxyl group-containing monomer and a hydroxyl group-containing monomer may be used as copolymerizable components in the production of the (meth)acrylate resin.

The crosslinkable functional group-containing monomer may be contained in an amount of more than 0 to not more than 20 wt % based on the weight of the mixture, the carboxyl group-containing monomer may be contained in an amount of more than 0 to not more than 10 wt % based on the weight of the mixture, and the hydroxyl group-containing monomer may be contained in an amount of more than 0 to not more than 20 wt % based on the weight of the mixture. Where the mixture contains the crosslinkable functional group-containing monomer within the above numerical range, it may exhibit excellent adhesive strength and the protective film may also have excellent folding performance.

According to one embodiment of the present disclosure, the carboxyl group-containing monomer may include at least one of (meth)acrylic acid, 2-(meth)acryloyloxy acetic acid, 3-(meth)acryloyloxy propylic acid, 4-(meth)acryloyloxy butyric acid, an acrylic acid dimer, itaconic acid, maleic acid and a maleic anhydride. Preferably, the carboxyl group-containing monomer may be acrylic acid.

The hydroxyl group-containing monomer may include at least one of 2-hydroxyethyl (meth)acrylate, 2-hydroxypropyl (meth)acrylate, and 4-hydroxybutyl (meth)acrylate.

According to one embodiment of the present disclosure, the mixture may be copolymerized to produce a (meth)acrylate resin. Specifically, the mixture may be bulk- or solution-polymerized to produce a (meth)acrylate resin.

According to one embodiment of the present disclosure, the (meth)acrylate resin may have a weight-average molecular weight of 100,000 g/mol to 3,000,000 g/mol. The weight-average molecular weight is one of average molecular weights which are used as molecular weight standards for a certain polymer material with a non-uniform molecular weight. The weight-average molecular weight is a weight fraction value obtained by averaging the molecular weights of component molecular species of a polymer compound having a molecular weight distribution. The weight-average molecular weight may be measured through gel permeation chromatography (GPC) analysis.

According to one embodiment of the present disclosure, the glass transition temperature value of the adhesive composition may be −30° C. or less, −120° C. to −30° C., or −110° C. to −30° C. Where the glass transition temperature of the adhesive composition satisfies the above numerical range, the adhesive composition may have excellent durability when folded at low temperature.

As the glass transition temperature value of the adhesive composition according to one embodiment of the present disclosure satisfies the above range, the adhesive composition has particularly excellent folding characteristics. That is, where the contents of the (meth)acrylate monomer, the carboxyl group-containing monomer and the photoinitiator monomer, which are contained in the mixture which is the raw material of the (meth)acrylate resin included in the adhesive composition according to the present disclosure, are adjusted within specific ranges, the glass transition temperature of the adhesive composition may be adjusted to −30° C. or less, and thus an adhesive layer having particularly excellent folding characteristics may be formed.

In the present specification, the glass transition temperature may be measured using a differential scanning calorimetry (DSC, Mettler). Specifically, the glass transition temperature is a value measured by, after about 10 mg of a sample is sealed in a dedicated pan and heated under a constant temperature-raising environment, drawing temperature-dependent endothermic and exothermic amounts of the material resulting from the occurrence of a phase transition.

Specifically, the glass transition temperature is a nominal value described in documents, catalogs, etc., or is a value calculated based on the following general expression (1) (Fox equation):

$$1/Tg = W1/Tg1 + W2/Tg2 + \ldots + Wn/Tgn \quad \text{[General Expression (1)]}$$

wherein Tg represents the glass transition temperature (unit: K) of polymer A, Tgi (i=1, 2, . . . n) represents the glass transition temperature (unit: K) of a homopolymer formed from monomer i, and Wi (i=1, 2, . . . n) represents a weight fraction in the total monomer components of monomer i.

General expression (1) above refers to a calculation expression which is used when polymer A includes n kinds of monomer components (monomer 1, monomer 2, . . . monomer n). In one embodiment of the present disclosure, the content of each monomer may be estimated through component analysis, and thus the glass transition temperature of the adhesive composition may be calculated based on the Fox equation.

According to one embodiment of the present disclosure, the adhesive composition may further contain at least one of a solvent, a curing agent, a dispersant, a thermal initiator, a silane coupling agent, a plasticizer, a tackifier, a photoinitiator, an antioxidant and a UV stabilizer.

If the adhesive composition contains an excessive amount of a curing agent, the initial adhesive strength of the adhesive composition may be so low that it is impossible to attach the foldable display protective film to the foldable display. For this reason, the curing agent is preferably contained in an amount of 1 wt % or less.

Where the adhesive composition contains an antioxidant or an UV stabilizer, the rate of weakening of the adhesive strength of the foldable display protective film may be low. That is, the adhesive strength may be lowered more slowly, and thus the problem that the foldable display protective film is detached during use by a user may not occur.

Where the adhesive composition contains a photoinitiator and the (meth)acrylate resin contains a carbon-carbon double bond, additional crosslinking may be induced, so that the crosslinking of the adhesive layer may further proceed when the adhesive layer is irradiated with UV light, thus reducing the adhesive strength thereof.

In one embodiment of the present disclosure, the crosslinking agent may include a crosslinkable compound. As the crosslinking agent, an isocyanate-based crosslinking agent may be used, and a crosslinking agent in the art may be used.

According to one embodiment of the present disclosure, the crosslinkable compound may include at least one selected from the group consisting of compounds obtained by esterifying polyhydric alcohol, such as hexanediol di(meth)acrylate, ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethyl phthalate, propylene glycol di(meth)acrylate having 2 to 14 propylene groups, dipentaerythritol penta(meth)acrylate, dipentaerythritol hexa(meth)acrylate, and a mixture of an acidic modification of dipentaerythritol penta(meth)acrylate and dipentaerythritol hexa(meth)acrylate (commercially available under the trade name TO-2348 or TO-2349 from TOAGOSEI Co., Ltd.), with α,β-unsaturated carboxylic acids; compounds obtained by adding (meth)acrylic acid to a compound containing a glycidyl group, such as a trimethylolpropane triglycidylethercrylic acid adduct and a bisphenol A diglycidylethercrylic acid adduct; ester compounds obtained from a polyhydric carboxylic acid and a compound having a hydroxyl group or an ethylenically unsaturated bond, such as phthalic acid diester of β-hydroxyethyl(meth)acrylate and toluene diisocyanate adduct of β-hydroxyethyl(meth)acrylate, or adduct with polyisocyanate; (meth)acrylic acid alkyl esters, such as methyl (meth)acrylate, ethyl(meth)acrylate, butyl(meth)acrylate, and 2-ethylhexyl(meth)acrylate; and 9,9'-bis[4-(2-acryloyloxyethoxy)phenyl]fluorene. However, the crosslinkable compound is not limited thereto, and general compounds known in the art may be used as the crosslinkable compound.

As the thermal initiator, one known in the art may be used.

As the solvent, toluene, methyl ethyl ketone (MEK), methyl isobutyl ketone (MIBK), or ethyl acetate (EAc) may be used, but the solvent is not limited thereto as long as the solvent may dissolve a specific compound, and a general organic solvent may be used.

According to one embodiment of the present disclosure, the adhesive layer may include the adhesive composition itself, or may include a dried or cured product of the adhesive composition. Specifically, the adhesive layer may be crosslinked by thermal curing or photocuring of the (meth)acrylate resin included in the adhesive composition, thus exhibiting excellent initial adhesive strength.

According to one embodiment of the present disclosure, the thickness of the adhesive layer may be 10 μm to 100 μm, 12 μm to 75 μm, or 15 μm to 50 μm. Where the adhesive layer has a thickness within the above numerical range, the rate of bubble generation in the adhesive layer may be lowered, and thus when the adhesive layer is attached to a cover window later, it may exhibit excellent adhesive strength, no exfoliation occurs, and a dent problem does not arise.

According to one embodiment of the present disclosure, the thickness of the protective substrate may be 25 μm to 150 μm, 38 μm to 130 μm, or 50 μm to 125 μm. Where the protective substrate has a thickness within the above numerical range, the protective film obtained by laminating the adhesive layer on the protective substrate may have a small thickness, and when the protective film is applied to a foldable display, no fold mark occurs, and the cover window of the foldable display may be sufficiently protected from external impact The protective substrate may be transparent, and as used herein, the term "transparent" may mean that the light transmittance of visible light (400 to 700 nm) is 80% or more.

According to one embodiment of the present disclosure, the protective substrate may be selected from the group consisting of polyethylene terephthalate (PET), polyester, polycarbonate (PC), polyimide (PI), polyethylene naphthalate (PEN), polyether ether ketone (PEEK), polyarylate (PAR), polycyloolefin (PCO), polynorbornene, polyethersulfone (PES), glass, and a cycloolefin polymer (COP).

The thickness of the foldable display protective film according to one embodiment of the present disclosure may be 35 µm to 250 µm, 50 µm to 200 µm, or 60 µm to 150 µm. Where the foldable display protective film has a thickness within the above numerical range, it may have a suitable thickness when applied to a foldable display later. In addition, in this case, a decrease in the adhesive strength thereof does not occur when the foldable display protective film is applied to a display, and it is possible to provide a protective film which has excellent reliability even when the display is repeatedly folded and unfolded several times.

According to one embodiment of the present disclosure, a release film may be provided on a surface of the adhesive layer, which is opposite to a surface thereof being in contact with the protective substrate.

As the release film, a hydrophobic film may be used. The release layer is a layer for protecting the adhesive sheet having a very small thickness, and refers to a transparent layer which is attached to one surface of the adhesive sheet. As the release film, a film excellent in terms of excellent mechanical strength, thermal stability, moisture shielding property, isotropic property, etc., may be used. For example, as the release film, an acetate-based resin film such as triacetylcellulose (TAC), a polyester-based resin film, a polyethersulfone-based resin film, a polycarbonate-based resin film, a polyamide-based resin film, a polyimide-based resin film, a polyolefin-based resin film, a cycloolefin-based resin film, a polyurethane-based resin film or an acrylic resin film may be used, but the release film is not limited thereto as long as the release film is a commercially available silicone-treated release film.

The release film may be completely removed when it is applied to a display.

The foldable display protective film according to one embodiment of the present disclosure may have an adhesive strength of 800 gf/in or more, 842 gf/in or more, 900 gf/in or more, 930 gf/in or more, 1000 gf/in or more, 1021 gf/in or more, 1351 gf/in or more, or 1585 gf/in or more, as measured at 23° C. and 50 RH % before light irradiation after a surface of the adhesive layer, which is opposite to a surface thereof being in contact with the protective substrate, is attached to a PI substrate, and may have an adhesive strength of 10 gf/in to 300 gf/in, 60 gf/in to 300 gf/in, 60 gf/in to 258 gf/in, 75 gf/in to 258 gf/in, 75 gf/in to 163 gf/in, 157 gf/in to 163 gf/in, 163 gf/in to 258 gf/in, or 258 gf/in to 300 gf/in, as measured at 23° C. and 50 RH % after irradiation with light having a wavelength of 380 nm or less after the surface of the adhesive layer, which is opposite to the surface thereof being in contact with the protective substrate, is attached to the PI substrate.

The foldable display protective film according to one embodiment of the present disclosure may have a difference of at least 500 gf/in or at least 600 gf/in between the adhesive strength measured at 23° C. and 50 RH % before light irradiation after a surface of the adhesive layer, which is opposite to a surface thereof being in contact with the protective substrate, is attached to a PI substrate, and the adhesive strength measured at 23° C. and 50 RH % after irradiation with light having a wavelength of 380 nm or less after the surface of the adhesive layer, which is opposite to the surface thereof being in contact with the protective substrate, is attached to the PI substrate.

After the foldable display protective film is applied to a foldable display, the adhesive layer may be exposed to UV light during use by a user, a photocrosslinking reaction may further proceed by the photoinitiator monomer or photoinitiator contained in the adhesive layer, and as the degree of curing of the adhesive layer increases, the adhesive strength thereof may decrease as described above.

Where the difference in the adhesive strength between before and after light irradiation is great as described above, the foldable display protective film has excellent initial adhesive strength, and thus it may remain stably attached to the foldable display during use by a user, and the adhesive strength thereof may gradually decrease due to exposure to UV light or the like during use. In addition, when the foldable display protective film needs to be peeled due to the need for replacement, it may be removed smoothly.

According to one embodiment of the present disclosure, the protective substrate may be maintained without being damaged or detached when subjected to a 4-mm radius folding test, and thus the foldable display protective film according to the present disclosure may also be applied to a thin foldable display.

The term "4-mm radius folding test" may refer to a test in which a surface of the adhesive layer, which is opposite to a surface thereof being in contact with the protective substrate, is attached to a PI substrate, and then the attached structure is folded such that the outer surface thereof becomes the protective substrate and the curvature thereof is 4R (the spacing between the protective films is 8 mm), and then the structure is left to stand for 1 day and unfolded and checked for its appearance. When the result of the 4-mm radius folding test indicates that the adhesion between the PI substrate and the adhesive layer is maintained and there is no change in the appearance, that is, the protective substrate is neither damaged nor detached, it may be considered that the foldable display protective film has excellent folding performance.

The foldable display protective film according to one embodiment of the present disclosure may have a haze of more than 0% to not more than 2%, more than 0% to not more than 1.5%, or more than 0% to not more than 1.35%, and may have a yellow index of more than 0 to not more than 3, more than 0 to not more than 2, more than 0 to not more than 1, or more than 0 to not more than 0.95, and may also have a light transmittance of at least 85%, at least 90%, or at least 92% at a wavelength of 550 nm. Where the haze, yellow index and light transmittance of the foldable display protective film satisfy the above numerical ranges, the foldable display protective film may have excellent transparency and optical properties, and thus even after the foldable display protective film is attached to a foldable display, the user can see the content displayed on the display without visual distortion.

In accordance with another aspect of the present disclosure, there is provided a foldable display device including: a foldable display; and the foldable display protective film according to the present disclosure provided on one surface of the foldable display, wherein the adhesive layer of the foldable display protective film is in contact with one surface of the foldable display.

In one embodiment of the present disclosure, the foldable display may have a structure in which a flexible substrate, an organic light-emitting layer, a polarizing plate and a cover window are sequentially laminated, and the adhesive layer of the foldable display protective film may be provided on a surface of the cover window, which is opposite to a surface thereof being in contact with the polarizing plate.

The foldable display protective film according to the present disclosure is for preventing the cover window of the foldable display from being scratched and protecting the cover window, and the protective substrate may be attached to one surface of the cover window through the adhesive layer.

The foldable display protective film according to one embodiment of the present disclosure may be used to protect the cover window of a foldable display device.

In one embodiment of the present disclosure, the flexible substrate may be selected from the group consisting of thermoplastic polyurethane (TPU), polydimethylsiloxane (PDMS), glass, polyethylene terephthalate (PET), polyester, polycarbonate (PC), polyimide (PI), polyethylene naphthalate (PEN), polyether ether ketone (PEEK), polyarylate (PAR), polycycloolefin (PCO), polynorbornene, polyethersulfone (PES), and a cycloolefin polymer (COP). Specifically, the flexible substrate may be polyimide (PI), and the polyimide (PI) may be transparent polyimide (PI).

MODE FOR INVENTION

Hereinafter, the present disclosure will be described in detail with reference to examples. However, the examples according to the present disclosure may be modified into various different forms, and the scope of the present disclosure is not construed as being limited to the examples described below. The examples in the present specification are provided to more completely describe the present disclosure to those skilled in the art.

Preparation of (Meth)Acrylate Resins

Preparation Examples 1 to 8

Components were mixed together in the amounts described in Table 1 below, and each of the mixtures was subjected to solution polymerization to produce (meth) acrylate resins.

TABLE 1

|  | Alkyl (meth)acrylate monomer | Photoinitiator monomer | Crosslinkable functional group-containing monomer |
|---|---|---|---|
| Preparation Example 1 | 97 wt % of 2-EHA | 1 wt % of BPMA | 2.0 wt % of AA |
| Preparation Example 2 | 97.5 wt % of 2-EHA | 0.5 wt % of BPMA | 2 wt % of AA |
| Preparation Example 3 | 98 wt % of 2-EHA | 0.5 wt % of BPMA | 1.5 wt % of AA |
| Preparation Example 4 | 98.9 wt % of 2-EHA | 0.1 wt % of BPMA | 1.0 wt % of AA |
| Preparation Example 5 | 59 wt % of 2-EHA, and 20 wt % LA | 1.0 wt % of BPMAm | 20.0 wt % of 4-HBA |
| Preparation Example 6 | 58.3 wt % of 2-EHA, and 19.4 wt % of LA | 2.9 wt % of BPMAm | 19.4 wt % of 4-HBA |
| Preparation Example 7 | 57.2 wt % of 2-EHA, and 19.0 wt % of LA | 4.8 wt % of BPMAm | 19.0 wt % of 4-HBA |
| Preparation Example 8 | 54.6 wt % of 2-EHA, and 18.2 wt % LA | 9.0 wt % of BPMAm | 18.2 wt % of 4-HBA |

In Table 1 above, 2-EHA is 2-ethylhexyl acrylate, LA is lauryl acrylate, and MA is methyl acrylate. In addition, BPMA is 4-benzoylphenyl (meth)acrylate, BPMAm is N-(2-benzoylphenyl)acrylamide, AA is acrylic acid, 4-HBA is 4-hydroxybutyl acrylate, and 2-HEA is 2-hydroxyethyl acrylate.

Preparation Example 9

20 parts by weight of 2-ethylhexyl acrylate, 55 parts by weight of methyl acrylate and 25 parts by weight of 2-hydroxyethyl acrylate were mixed together and subjected to solution polymerization to produce a prepolymer. Then, 20 parts by weight of the monomer Karenz MOI (Showa Denko Co., Ltd.) containing an isocyanate group and an acrylate group was added to the prepolymer, followed by second polymerization, thereby producing a (meth)acrylate resin.

Fabrication of Foldable Display Protective Films

Example 1

0.03 parts by weight of the epoxy-based curing agent BXX-5240 was added to and dispersed in the (meth)acrylate resin produced in Preparation Example 1, thus preparing an adhesive composition. Next, the adhesive composition was applied onto a U483 50-μm PET film (Toray Co., Ltd.), and then dried and cured to a final thickness of 25 μm, thereby fabricating a foldable display protective film.

Examples 2 to 5 and Comparative Examples 1 to 4

Foldable display protective films were fabricated in the same manner as in Example 1 above, except that a curing agent and/or a photoinitiator was added to and dispersed in the (meth)acrylate resin as described in Table 2 below.

TABLE 2

|  | (Meth)acrylate resin | Curing agent | Photoinitiator |
|---|---|---|---|
| Example 1 | Preparation Example 1 | 0.03 parts by weight of BXX-5240 | — |
| Example 2 | Preparation Example 2 | 0.03 parts by weight of BXX-5240 | — |

TABLE 2-continued

|  | (Meth)acrylate resin | Curing agent | Photoinitiator |
|---|---|---|---|
| Example 3 | Preparation Example 3 | 0.03 parts by weight of BXX-5240 | — |

TABLE 2-continued

|  | (Meth)acrylate resin | Curing agent | Photoinitiator |
|---|---|---|---|
| Comparative Example 1 | Preparation Example 4 | 0.03 parts by weight of BXX-5240 | — |
| Example 4 | Preparation Example 5 | 0.07 parts by weight of TKA-100 | — |
| Example 5 | Preparation Example 6 | 0.07 parts by weight of TKA-100 | — |
| Comparative Example 2 | Preparation Example 7 | 0.07 parts by weight of TKA-100 | — |
| Comparative Example 3 | Preparation Example 8 | 0.07 parts by weight of TKA-100 | — |
| Comparative Example 4 | Preparation Example 9 | 2 parts by weight of MHG-80B | 20 parts by weight of IRG184 |

In Table 2 above, BXX-5240 is an epoxy-based curing agent, TKA-100 and MHG-80B are isocyanate-based curing agents, and IRG 184 is Irgacure 184.

Evaluation of Physical Properties

Measurement of Initial Adhesive Strength

Each of the foldable display protective films fabricated in Examples 1 to 5 and Comparative Examples 1 to 4 was attached to a transparent PI substrate and subjected to a 180° peel test at 23° C., 50 RH % and a peel rate of 300 mm/min, thereby measuring the initial adhesive strength thereof before light irradiation.

Measurement of Adhesive Strength After Light Irradiation

Each of the foldable display protective films fabricated in Examples 1 to 5 and Comparative Examples 1 to 4 was attached to a transparent PI substrate, and irradiated with light (320 to 390 nm wavelength) having UVA energy of 3,000 mJ/cm$^2$ or more (measured by UV power puck 2, EIT Co., Ltd.) using a metal halide lamp. Thereafter, each of the protective films was subjected to a 180° peel test at 23° C., 50 RH % and a peel rate of 300 mm/min, thereby measuring the adhesive strength thereof after light irradiation.

Measurement of Optical Properties

Each of the foldable display protective films fabricated in Examples 1 to 5 and Comparative Examples 1 to 4 was placed on a colorimeter device, and the haze, yellow index and light transmittance thereof were measured.

As the colorimeter device, COH-400 (a product of Nippon Denshoku Industries Co., Ltd.) was used.

Evaluation of 4R Folding

Each of the foldable display protective films fabricated in Examples 1 to 5 and Comparative Examples 1 to 4 was attached to a transparent PI substrate, and irradiated with light (320 to 390 nm wavelength) having UVA energy of 3,000 mJ/cm$^2$ or more (measured by UV power puck 2, EIT Co., Ltd.) using a metal halide lamp. Next, the attached structure was folded such that the curvature thereof was 4R (the spacing between the protective films was 8 mm) and the outer surface thereof became the protective substrate, and then the structure was left to stand for 1 day, and then unfolded and checked for its appearance.

The adhesive strength, haze, yellow index and light transmittance measured as described above are shown in Table 3 below.

TABLE 3

|  | Initial adhesive strength (gf/in) | Final adhesive strength (gf/in) | Haze (%) | Yellow index | Light transmittance (%) | 4R folding evaluation after UV irradiation at 3,000 mJ/cm$^2$ |
|---|---|---|---|---|---|---|
| Example 1 | 1021 | 75 | 1.00 | 0.14 | 92.06 | Maintained |
| Example 2 | 930 | 157 | 1.15 | 0.24 | 91.89 | Maintained |
| Example 3 | 842 | 163 | 1.34 | 0.19 | 92.13 | Maintained |
| Comparative Example 1 | 691 | 475 | 1.12 | 0.20 | 91.98 | Maintained |
| Example 4 | 1585 | 60 | 1.11 | 0.88 | 92.29 | Maintained |
| Example 5 | 1351 | 258 | 1.12 | 0.93 | 92.32 | Maintained |
| Comparative Example 2 | 1293 | 435 | 1.04 | 0.89 | 92.27 | Maintained |
| Comparative Example 3 | 1371 | 939 | 1.22 | 1.75 | 91.89 | Maintained |
| Comparative Example 4 | 1265 | 4 | 0.67 | 0.52 | 91.47 | Detached |

Referring to Table 3 above, it can be confirmed that the foldable display protective films of Examples 1 to 5 had a very high initial adhesive strength of 842 gf/in or more, but the adhesive strength thereof after light irradiation significantly decreased to a value of 75 to 258 gf/in. That is, it can be confirmed that, when each of the protective films is exposed to UV light, the adhesive strength thereof is lowered, so that each protective film may be peeled without causing damage to the cover window. On the other hand, it can be confirmed that Comparative Example 1 had an excessively low initial adhesive strength and an excessively high final adhesive strength, and Comparative Examples 2 to 4 had excellent initial adhesive strength, but had an excessively low or high final adhesive strength.

Measurement of UV Dose-Dependent Changes in Adhesive Strength

The foldable display protective film fabricated in Example 1 was attached to a transparent PI substrate, and the adhesive strength thereof was measured while the UV dose was changed.

FIG. 1 is a graph showing UV dose-dependent changes in the adhesive strength of the foldable display protective film fabricated in Example 1.

Referring to FIG. 1, it can be confirmed that the adhesive strength of the protective film decreased as the UV dose increased. Referring to the table inserted in FIG. 1, it can be confirmed that, when the UV dose was 0 mJ/cm$^2$, the initial adhesive strength of the protective film was very high at 1,021 gf/in. However, it can be confirmed that, when the UV dose was about 562 mJ/cm$^2$, the adhesive strength of the protective film significantly decreased to about 300 gf/in. In addition, it can be confirmed that, when the UV dose reached 3,000 mJ/cm$^2$ or more, the adhesive strength level of the protective film no longer decreased and was maintained. This means that the crosslinking of the adhesive layer has been sufficiently progressed up to the maximum level, and there was no further variation in the adhesive strength.

The invention claimed is:

1. A foldable display protective film comprising:
   an adhesive layer comprising an adhesive composition comprising a (meth)acrylate resin comprising a copolymerized product of a mixture containing an alkyl (meth)acrylate monomer, a crosslinkable functional group-containing monomer, and a photoinitiator monomer; and
   a protective substrate provided on one surface of the adhesive layer,
   wherein,
   the photoinitiator monomer is contained in an amount of 0.2 to 4.5 wt % based on the total weight of the mixture,
   the crosslinkable functional group-containing monomer is contained in an amount of more than 0 to not more than 20 wt % based on the total weight of the mixture,
   the protective substrate is maintained without being damaged or detached when subjected to a 4-mm radius folding test, and
   the protective film satisfies the following equation 1:

$$1 \leq 100*B/A \leq 30 \quad \text{[Equation 1]}$$

wherein
   A is an adhesive strength measured at 23° C. and 50 RH % before light irradiation after a surface of the adhesive layer, which is opposite to a surface thereof being in contact with the protective substrate, is attached to a PI substrate, and
   B is an adhesive strength measured at 23° C. and 50 RH % after the irradiation with light having a wavelength of 380 nm or less after the surface of the adhesive layer, which is opposite to the surface thereof being in contact with the protective substrate, is attached to the PI substrate.

2. The foldable display protective film of claim 1, wherein A is at least 800 gf/in, and B is 10 gf/in to 300 gf/in.

3. The foldable display protective film of claim 1, wherein the photoinitiator monomer is a benzophenone-based compound having a (meth)acrylate group.

4. The foldable display protective film of claim 1, wherein the alkyl (meth)acrylate monomer comprises at least one of pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, or decyl (meth)acrylate.

5. The foldable display protective film of claim 1, wherein the crosslinkable functional group-containing monomer comprises at least one of a carboxyl group-containing monomer or a hydroxyl group-containing monomer.

6. The foldable display protective film of claim 5, wherein the carboxyl group-containing monomer comprises at least one of (meth)acrylic acid, 2-(meth)acryloyloxy acetic acid, 3-(meth)acryloyloxy propylic acid, 4-(meth)acryloyloxy butyric acid, an acrylic acid dimer, itaconic acid, maleic acid, or a maleic anhydride.

7. The foldable display protective film of claim 5, wherein the hydroxyl group-containing monomer comprises at least one of 2-hydroxyethyl (meth)acrylate, 2-hydroxypropyl (meth)acrylate, or 4-hydroxybutyl (meth)acrylate.

8. The foldable display protective film of claim 1, wherein the adhesive composition further comprises at least one of a solvent, a curing agent, a dispersant, a thermal initiator, a silane coupling agent, a plasticizer, a tackifier, a photoinitiator, an antioxidant, or a UV stabilizer.

9. The foldable display protective film of claim 1, wherein the adhesive layer has a thickness of 10 μm to 100 μm.

10. The foldable display protective film of claim 1, wherein the protective substrate has a thickness of 25 μm to 150 μm.

11. The foldable display protective film of claim 1, wherein the protective substrate is selected from the group consisting of polyethylene terephthalate (PET), polyester, polycarbonate (PC), polyimide (PI), polyethylene naphthalate (PEN), polyether ether ketone (PEEK), polyarylate (PAR), polycycloolefin (PCO), polynorbornene, polyethersulfone (PES), glass, and a cycloolefin polymer (COP).

12. The foldable display protective film of claim 1, further comprising a release film provided on a surface of the adhesive layer, which is opposite to a surface thereof being in contact with the protective substrate.

13. The foldable display protective film of claim 1, having a haze of more than 0% to not more than 2%, a yellow index of more than 0 to not more than 3, and a light transmittance of 85% or more at a wavelength of 550 nm.

14. A foldable display device comprising:
    a foldable display; and
    the foldable display protective film according to claim 1 provided on one surface of the foldable display,
    wherein the adhesive layer of the foldable display protective film is in contact with one surface of the foldable display.

15. The foldable display device of claim 14, wherein the foldable display has a structure in which a flexible substrate, an organic light-emitting layer, a polarizing plate and a cover window are sequentially laminated, and the adhesive layer of the foldable display protective film is provided on a surface of the cover window, which is opposite to a surface thereof being in contact with the polarizing plate.

16. The foldable display device of claim 15, wherein the flexible substrate is at least one of thermoplastic polyurethane (TPU), polydimethylsiloxane (PDMS), glass, polyethylene terephthalate (PET), polyester, polycarbonate (PC), polyimide (PI), polyethylene naphthalate (PEN), polyether ether ketone (PEEK), polyarylate (PAR), polycycloolefin (PCO), polynorbornene, polyethersulfone (PES), or a cycloolefin polymer (COP).

* * * * *